US006206975B1

United States Patent
Rick et al.

(10) Patent No.: US 6,206,975 B1
(45) Date of Patent: *Mar. 27, 2001

(54) VACUUM TREATMENT SYSTEM FOR APPLICATION OF THIN, HARD LAYERS

(75) Inventors: Alfred Rick, Karlstein; Josef Hoffmann, Wörth; Klaus Michael, Gelnhausen, all of (DE)

(73) Assignee: Leybold Systems GmbH (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,491

(22) Filed: Apr. 30, 1999

(30) Foreign Application Priority Data

May 2, 1998 (DE) ............................. 198 19 726

(51) Int. Cl.[7] ............................................ C23C 16/00
(52) U.S. Cl. ......................... 118/719; 118/729; 118/730
(58) Field of Search ............................ 118/719, 730, 118/729, 731

(56) References Cited

U.S. PATENT DOCUMENTS

| | | | |
|---|---|---|---|
| 4,962,726 | * 10/1990 | Matsushita et al. | 118/719 |
| 4,992,298 | * 2/1991 | Deutchman et al. | 427/38 |
| 5,037,676 | * 8/1991 | Petropoulos et al. | 427/294 |
| 5,254,173 | * 10/1993 | Myers | 118/728 |
| 5,656,364 | * 8/1997 | Rickerby et al. | 428/216 |
| 5,763,020 | * 6/1998 | Yang | 427/569 |

* cited by examiner

Primary Examiner—Richard Bueker
Assistant Examiner—Erin Fieler
(74) Attorney, Agent, or Firm—Smith, Gambrell & Russell, LLP

(57) ABSTRACT

Vacuum treatment system for application of thin layers onto substrates (36, 38, 40, 42) with a transfer chamber (5) and several treatment chambers (6, 8, 10, 12), said treatment chambers peripherally attached to the transfer chamber and being connected to said transfer chamber by means of a common opening (27, 29, 31, 33) for inlet and outlet of substrate (36, 38, 40, 42), and with a handling device (24) for transport of the substrate (36, 38, 40, 42) between the treatment chambers (6, 8, 10, 12), whereby the handling device (24) has at least one substrate holder (37, 39, 41, 43) with one pivot and/or rotating retaining part to hold the substrates (36, 38, 40, 42), by means of which the substrates (36, 38, 40, 42) can pivot and/or rotate in the treatment chambers (6, 8, 10, 12).

7 Claims, 4 Drawing Sheets

B-B'

A—A'

VACUUM TREATMENT SYSTEM FOR APPLICATION OF THIN, HARD LAYERS

INTRODUCTION AND BACKGROUND

The present invention pertains to a vacuum treatment system to be used to apply thin, hard layers to substrates. A vacuum treatment system of this kind is composed of a transfer chamber and several treatment chambers allocated to it, such that the substrates to be coated can be inserted into or removed from the treatment chambers by means of a handling device located in the transfer chamber.

For coating of substrates by a coating method proceeding under low-pressure conditions, differing types of systems are known which are designed in accordance with the required treatment stations for the substrates. Depending on the desired coating method, e.g., a sputtering method or a vapor-coating method, and depending on the coating system to be applied onto the substrate, differing types of vacuum treatment systems are used. For example, coating systems consisting of several single layers are produced on the substrate by passing the substrate in sequence through individual coating stations, where in each coating station, a specific, single layer is deposited onto the substrate. Additional treatment stations are needed when the substrate is additionally to be subjected to heat treatment, or if the substrate surface is to be subjected to a preceding or subsequent plasma etching process. The configuration of the single treatment stations is established in a known manner either in cluster formation or as an inline system. When using the so-called inline system, the single treatment stations are arranged one behind the other and the substrate is transported successively through these treatment stations to implement the individual treatment steps. These systems have the advantage that they can be easily integrated into the overall process, either upstream or downstream from the vacuum treatment.

In the known cluster systems, the individual treatment chambers are positioned essentially peripherally to the central handling chamber in which a handling device is provided, by means of which the substrates are transported between the individual treatment chambers.

The essential advantage of cluster systems consists in the fact that they are of compact, space-saving design. One disadvantage of these cluster vacuum treatment systems is that the substrates to be treated can only be operated in a so-called batch mode. A continuous operation, like that possible in inline vacuum treatment systems, is usually not possible for cluster systems. For example, in the cluster system, a minimum number of treated substrates is enclosed in one of the treatment stations and after completed processing, all substrates are transported together from the cluster vacuum system.

An object of the present invention is to create a vacuum treatment system by means of which it is possible to process substrates by vacuum processes, where the process sequence can be integrated advantageously into existing production lines and a space-saving design will be obtained.

Another object of the present invention is to provide a method for coating of workpieces in this vacuum treatment system.

SUMMARY OF THE INVENTION

The above and other object of this invention can be achieved with a vacuum treatment system as described herein.

The vacuum treatment system according to this invention consists essentially of a transfer chamber and of several treatment chambers positioned peripherally to the transfer chamber and connected with it by means of common openings for inlet and outlet of the substrate. In the transfer chamber there is a handling device with which the substrates can be transported between the treatment chambers. In this regard, the handling device consists of at least one substrate holder by means of which the substrates to be transported are held. A smooth handling of the substrates within the individual treatment chambers will be ensured in that the substrate holder has a pivoting and/or rotating retaining unit, to which the substrate is attached, and with which the substrate located in the particular treatment chamber can pivot and/or rotate during the processing.

In addition, the invented vacuum treatment system consists of a treatment chamber which has an outer opening that can be closed by a cover. The substrates to be coated are moved into the vacuum treatment system and the coated substrates are removed from the system through this outlet opening. The advantage achieved with the invention consists, in particular, in that the vacuum treatment system can be filled continuously with the substrates to be coated and these can then be subjected to the vacuum treatment process in order then to remove them continuously from the system. At the same time, the vacuum treatment system according to this invention makes possible a compact design which enables integration into existing manufacturing systems.

In addition, due to the mounting of the substrates to be coated to a pivoting and/or rotating retaining unit, it is assured that the substrates in the individual treatment chambers are exposed uniformly to the treatment processes acting on the substrates. This will prevent the coatings to be deposited onto the substrate to be coated, from growing at different rates at different locations of the substrate surface due to their differing alignment to the coating source. Thus, the layer thickness will not be dependent on the substrate shape.

For coating of substrates, it is proposed to provide a vacuum coating device, preferably a vacuum vapor coating device, in at least one of the treatment chambers. For coating of a substrate, the material to be vaporized and deposited is melted or vaporized by heating in the vacuum vapor coating device and the substrate is placed into the material cloud for precipitation of the vaporized material onto the substrate surface.

The vacuum treatment system of the present invention is suitable for uniform depositing of hard, thin layers onto workpieces by means of a vacuum vapor coating method. In this regard, the workpieces to be coated are initially heated in a first treatment chamber in which a heater is located, to a sufficiently high temperature, preferably >800° C., and in the heated state they are moved by means of the handling device into a second treatment chamber containing the vapor coating device.

The hard, thin layers, for example, consist of metallic alloys of the MCrAlY type, where the alloy component M, consists at least of one of the substances nickel, cobalt or iron, or an alloy containing a percentage of the substances nickel, cobalt or iron. For melting of the vapor coating material, which consists of a base alloy of the composition stated above, the use of a known electron beam vaporizing source is suggested. In this case, the vapor coating source will supply the molten material from a reservoir preferably in rod shape.

BRIEF DESCRIPTION OF DRAWINGS

The present invention will be further understood with reference to the accompanying drawings, wherein.

DETAILED DESCRIPTION OF INVENTION

Figure 1:
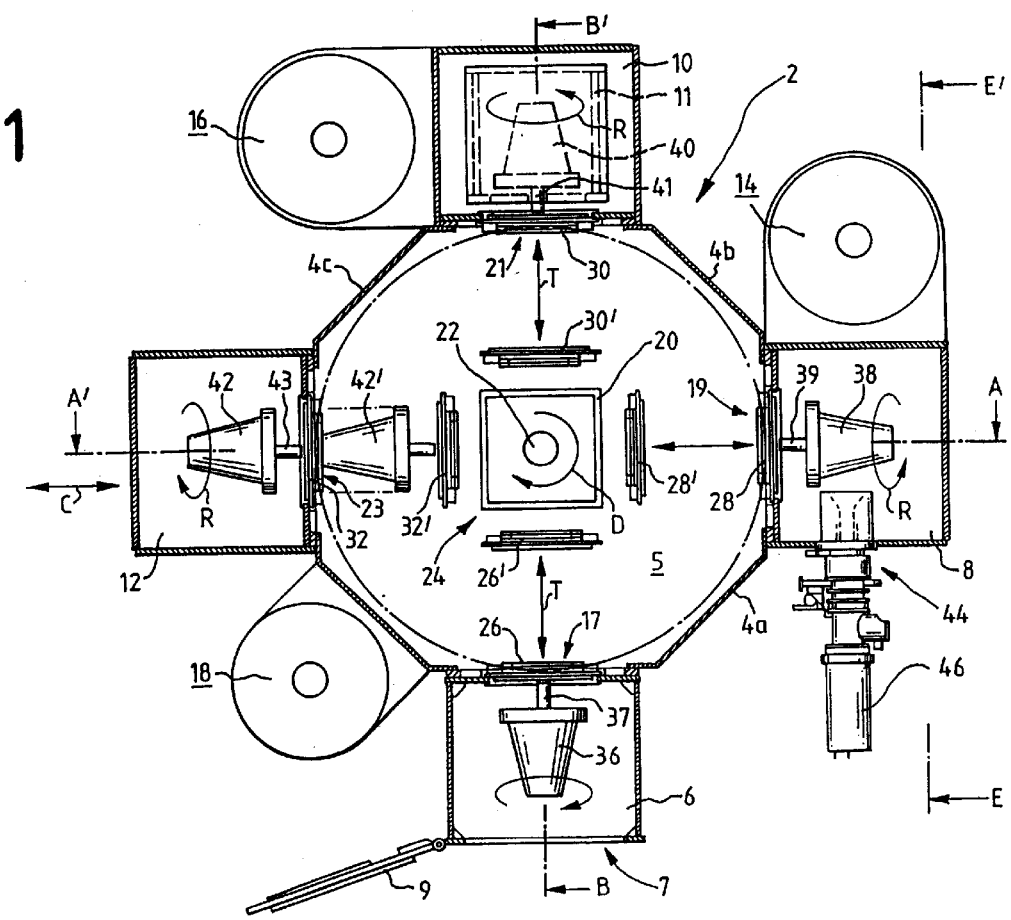
FIG. 1 represents a vacuum treatment system according to this invention, shown in a top, sectional view.

A vacuum treatment system according to this invention is suitable in a favorable manner for the manufacture of hard coatings on those workpieces which are intended for use in turbine systems. In particular, with this vacuum treatment system, hard, corrosion-resistant metallic and/or ceramic thermal insulating layers can be produced on turbine blades, preferably on turbine blades for use in gas turbine engines. However, in principle, application of the turbine blades coated by use of the invented vacuum treatment system is not limited to the gas turbine engine.

A method according to this invention for the manufacture of wear-resistant, hard coatings on substrates by means of the invented vacuum treatment system is composed of several process steps which will be discussed below.

First, the substrate to be coated is moved from the outside space into a first treatment chamber which has an outer opening, and the substrate is attached to the substrate holder protruding into this treatment chamber. The inner opening of the loading chamber located opposite the outer opening is sealed vacuum-tight from the transfer chamber by a cover plate during the loading process. Next, the load chamber is evacuated to adjust the pressure to the vacuum pressure prevailing in the transfer chamber. To move the substrate or substrates to be coated into a first treatment chamber, by actuation of the handling device, the cover plate is moved together with the substrates from the closed position into the assigned open-position. In this case, the handling device has a shaft or coil spindle seated in the vacuum chamber cover and/or in the vacuum chamber base plate of the transfer chamber; upon rotation of the operators allocated to the coil spindle, the cover plates connected with these operators are moved from a radially inner opening to a radial outer closed position, or from the closed position to the open position. For example, the operators consist of hoisting drivers or telescoping booms, which are articulated on one end on a spindle nut running on the spindle, and on the other end are connected to the cover plates. The cover plates have substrate holders or graspers on their side surfaces facing the treatment chambers.

By turning the handling device by a rotary angle of e.g., 90° or 180°, the substrate with the cover plate will be moved from the open-position of the first treatment chamber, into the open-position assigned to the second treatment chamber. By operation of the spindle drive or shaft drive of the handling device, the substrates are moved from this open-position into the allocated closed position. There, the substrate or substrates are placed into the second treatment chamber and by use of the sealing plate simultaneously separated vacuum-tight from the transfer chamber. For coating of substrates with hard, thin, corrosion-resistant layers, the substrates must be heated during the entire coating process to a minimum temperature. In this regard, the first treatment chamber has a heating unit with which the substrates ate heated to the required process temperature of e.g., at least 800° C., preferably to at least 1000° C.

The heated substrate is moved by means of the handling device from the second treatment chamber to a third treatment chamber, in a manner analogous to the transport from the loading chamber to the second treatment chamber. In this vacuum treatment chamber, there is a vacuum coating source, preferably a vaporization source, which is used to vapor coat the material onto the substrate. The substrates are preferably rotating or pivoting in the vapor cloud of coating material during the coating process and the substrates are thus coated uniformly because the coating is essentially independent of the spatial shape of the substrates.

To apply hard, thin coatings, it has proven to be advantageous to heat the molten material by means of a known electron beam vaporizer to the vapor coating temperature. While the molten material for the vapor coating has a high melting temperature, due to the electron beam arriving locally on the molten material, the needed melting or vaporization temperature is attained.

After ending the coating phase, the substrate is moved via the assigned open-position of the third treatment chamber, through subsequent rotation of the handling device about a rotary angle of 90°, for example, into the open-position of the neighboring treatment chamber. The substrate is then moved from this open-position into the allocated closed position of this treatment chamber which has a closable outer opening, while the inside of the treatment chamber is separated by the cover plate vacuum-tight from the transfer chamber. After venting the first treatment chamber designed as a loading or unloading chamber, the coated substrates are removed through the outer opening of the loading/unloading chamber, e.g., by means of a robot handling device.

The number of treatment chambers can be selected as a function of the particular vacuum treatment process. Preferably the treatment chambers are located equidistant from each other and peripherally to the transfer chamber. To transport the substrates by rotation of the handling device between neighboring open-positions, an angle $\alpha=360°/n$ is transited, where n corresponds to the number of treatment stations. In a vacuum treatment system according to this invention, the treatment chambers can also be set up at an unequal distance from each other, so that different values for a are obtained for the transport angle between two treatment chambers.

The vacuum treatment system according to this invention will be explained in greater detail below based on one particularly preferred design example which is illustrated in the attached drawings.

In FIG. 1, a vacuum treatment system 2 is presented which has a total of four treatment chambers 6, 8, 10, 12. These handling chambers 6, 8, 10, 12 are positioned peripherally to a transfer chamber 5, where the transfer chamber 5 has an octahedral cross section; the single treatment chambers 6, 8, 10, 12 are flanged to every other octahedral side.

The treatment chambers 6, 8, 10, 12 are each connected to the interior of the transfer chamber 5 by means of inner openings 17, 19, 21, 23. The individual treatment chambers 6, 8, 10, 12 differ in their function for one complete treatment cycle as follows:

treatment chamber 6 is used as loading and unloading chamber for the substrates 36, treatment chamber 12 is used for pretreatment and/or post-treatment of the substrates 42, 42', treatment chamber 10 is designed as a heating chamber in which the substrates 40 can be heated to a predetermined temperature, and treatment chamber 8 is designed as a coating chamber in which the substrates 38 are coated by the use of a coating source 65.

The individual treatment chambers 6, 8, 10, 12 and also the transfer chamber 5 can be evacuated to vacuum pressure by means of vacuum pumps 14, 16, 18. A handling device 24 is allocated essentially centrally to the treatment chambers 6, 8, 10, 12 (see FIG. 1) in the transfer chamber 5; this handling device is used for the transport of the substrates 36, 38, 40, 42, 42' between the treatment chambers 6, 8, 10, 12. The handling device 24 consists of a rotary table 20, which is rotary seated on a rotary axis 22. The rotary table 20 is driven by a motor 60 via a transmission 61 which is linked via a rotary drive shaft 55 to the rotary table 20.

A total of four cover plates 26, 28, 30, 32 corresponding to the number of treatment chambers 6, 8, 10, 12, are provided to the rotary table 20. These cover plates 26, 28, 30, 32 are used to seal the openings 17, 19, 21, 23 to the treatment chambers. In this case, the cover plates 26, 28, 30, 32 are each applied to an operator which is formed as push/pull struts 48a, b; 49a, b; 50a, b; 51a, b.

The push/pull struts 48a, b; 49a, b; 50a, b; 51a, b are articulated on one end to the rotary table 20 and permanently hold their connected cover plates 26, 28, 30, 32 in a perpendicular alignment. To close the treatment chamber openings 17, 19, 21, 23, the cover plates 26, 28, 30, 32 are moved from a radially inward, open-position 26', 28', 30', 32' to a radially outer closed position, and the operators cooperating directly with the drive shaft 57 or cooperating with it by means of a coil spindle, are designed as hoisting drive or telescoping boom.

Figure 2:
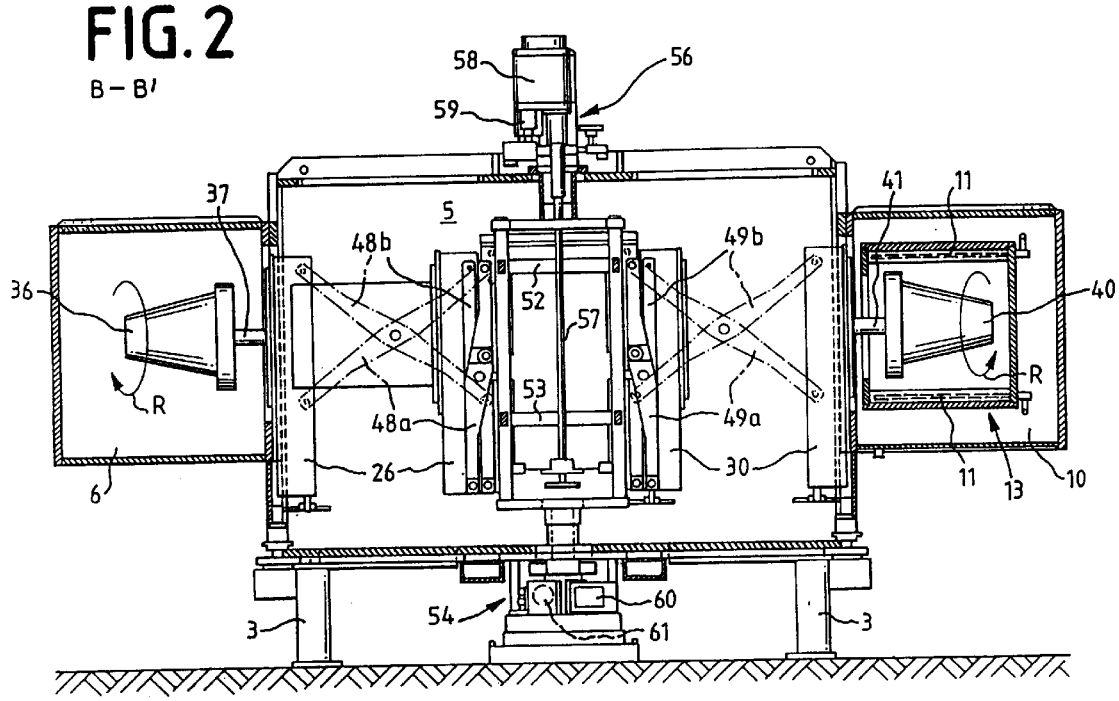
FIG. 2 represents a cross sectional view of the vacuum treatment system illustrated in FIG. 1, presented along the section line B—B'.
Figure 3:
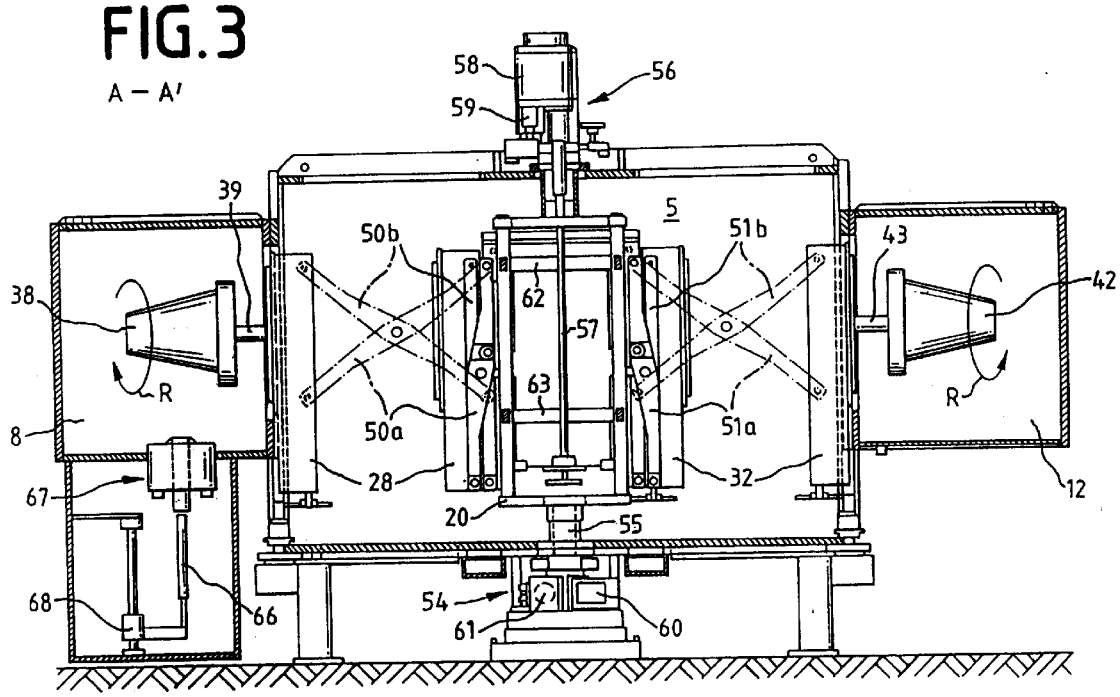
FIG. 3 represents a cross sectional view of the vacuum treatment system illustrated in FIG. 1, presented along the section line A—A'.

The cover plates 26, 28, 30, 32 each have on their side surfaces facing the treatment chambers 6, 8, 10, 12, substrate holders or graspers with which the substrates 36, 38, 40, 42, 42' are securely held and transported. The substrate holders 37, 39, 41, 43 are pivot mounted to the single cover plates 26, 28, 30, 32. By means of a drive mechanism not illustrated in the figures, the substrates 36, 38, 40, 42, 42' can pivot or rotate in the treatment chambers 8, 10, 12, in particular during the single treatment processes (see FIG. 2, FIG. 3). Due to this measure, the effect of heat, for example, or of coating material to be deposited onto the substrates 36, 38, 40, 42, 42', occurs uniformly over their entire surface, even on substrates 36, 38, 40, 42 having irregular surfaces.

For vacuum coating of a part of a substrate, this part will be attached individually or together with other substrate parts, to the substrate holder 37 protruding into the loading or unloading chamber 6. After closing the cover 9, the loading or unloading chamber 6 is evacuated to the pressure prevailing in the transfer chamber 5. By operating of the handling device 24, the substrate 36 and the cover plate 26 are first moved into the assigned, open-position 26'. Synchronously with this, the other substrates 38, 40, 42 are moved together with their associated cover plates 28, 30, 32 from the particular closed position, into the open-positions 28', 30', 32' allocated to the treatment chambers 8, 10, 12.

For subsequent transport of the substrates 36, 38, 40, 42 into the next treatment chamber, the transport drive 54 (see FIG. 2) is activated and the rotary table 20 is moved together with the handling device 24 and the substrates 36, 38, 40, 42 in the transport direction D.

For coating of substrates with hard, thin layers which are applied by vapor coating, it is necessary to hold the substrates during the entire coating process to a temperature of >800° C., preferably >1000° C. To do this, the substrate to be heated is first moved from the loading/unloading chamber 6 through a 180° rotation with respect to the heating chamber 10, and from the open position 30' by operation of the spindle drive 56 into the allocated closed position.

With the heater 11 provided in the heating chamber 10, the substrate 40 is heated under simultaneous rotation in the direction R uniformly to the preselected temperature. After completion of the warm-up phase, the substrate 40 is moved radially into the open position 30', and by a 90° rotation of the rotary table 20 about the rotary axis 22 and a radial transport motion, it is moved into the coating chamber 8. In the coating chamber 8 the substrate 38 is then moved into a material cloud W, which is created, for example, by means of a conventional vaporization source 65, for precipitation of the vaporized molten material 66 on the substrate 38.

Figure 4:
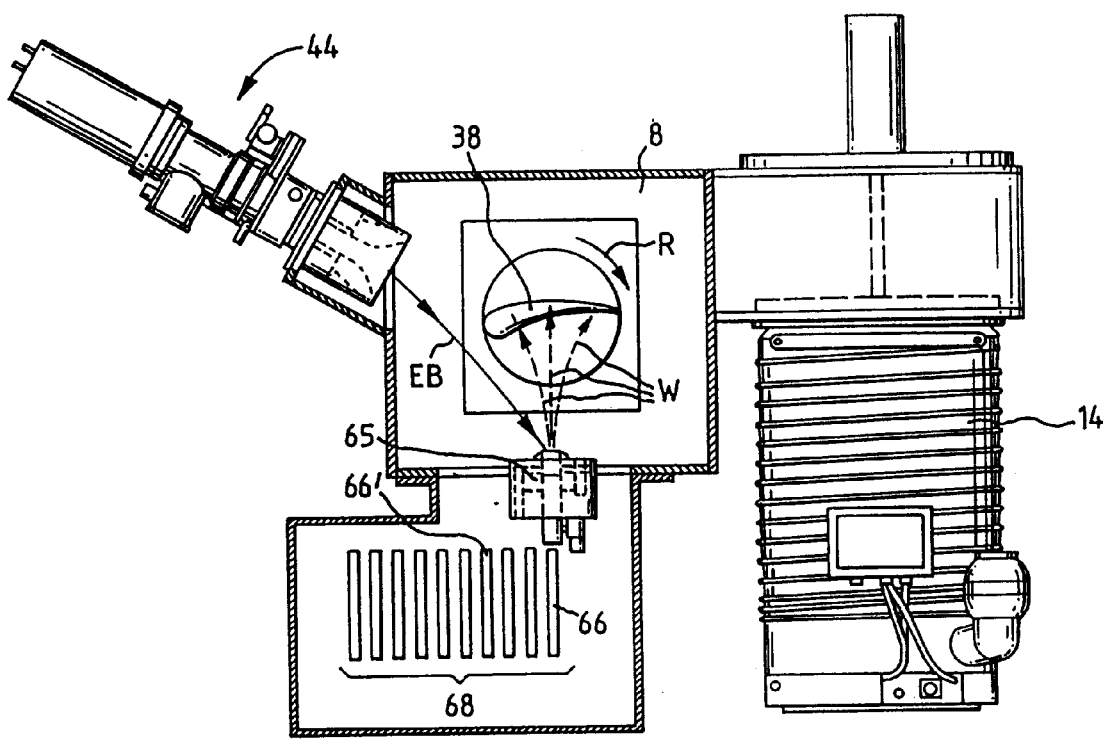
FIG. 4 represents a partial sectional side view of the vacuum treatment system illustrated in FIG. 1, presented along the section line E—E'.

In order to obtain a uniform, homogeneous coating of the substrate 38 independently of the precipitation site on the substrate 38, the substrate 38 rotates about the axis of the substrate holder 39 in the rotary direction R (see FIG. 4). The coating source 65 pertains to an electron beam vaporization source which is composed of a conventional electron beam gun 44 and the vaporizer 65. The molten material 66 to be vaporized is moved from a molten material reservoir 68 (see FIG. 4) to the vaporizer 65 in rod form.

The electron beam EB emitted from the electron beam gun 44 is fired with an energy of 35 keV, for example, against the free front surface of the melt material rod 66 protruding from the vaporizer 65 and is directed through a magnetic field generated by a coil (not illustrated in the figures). The molten material 66 melts at the impact point of the electron beam EB and vaporizes to form a material cloud W which is precipitated upon the substrate surface of the substrate 38.

After completion of the coating phase for the substrate 38, the substrate will be transported either through another 90° transport cycle to the loading/unloading chamber 6 for ejection from the vacuum treatment system 2, or will be post-treated in the treatment chamber 12. As post-treatment process, a subsequent oxidation of the coated substrate surface can take place by inlet of a reactive oxidizing gas, or the substrate can also be exposed to another heat treatment.

Further variations and modifications of the foregoing will be apparent to those skilled in the art and are intended to be encompassed by the claims appended hereto.

German priority application 198 19 726.8 is relied on and incorporated herein by reference.

We claim:

1. A vacuum treatment system for deposition of thin layers onto a substrate comprising a transfer chamber and a plurality of treatment chambers, said treatment chambers being peripherally attached to the transfer chamber and being connected to said transfer chamber by means of openings for inlet and outlet of said substrate, a handling device for transport of the substrate between the treatment chambers, said handling device having several substrate holders each with one pivotable retaining part, one rotating retaining part or one pivotal and rotating retaining part to hold the substrate, whereby several substrates can be pivoted, rotated or pivoted and rotated while located in different ones of said treatment chambers.

2. The vacuum treatment system according to claim 1, wherein said at least one treatment chamber has an outlet opening which can be closed by a lid, and the substrate can move through the outlet opening into and/or out of the vacuum treatment system.

3. The vacuum treatment system according to claim 1, wherein said at least one treatment chamber has a heater so that the substrates can be heated.

4. The vacuum treatment system according to claim 1, wherein said at least one treatment chamber has a vacuum coating device, which is used to coat the substrate with a material for vapor coating.

5. The vacuum treatment system according to claim 4 wherein said vacuum coating device is a vacuum vapor coating device.

6. The vacuum treatment system according to claim 5, wherein a material to be vapor coated consists of a base alloy of the composition MCrAlY, where the base alloy constituent M contains at least one member selected from the group consisting of nickel, cobalt, iron, and alloys thereof.

7. A vacuum treatment system according to claim 1, comprising at least one loading and unloading chamber and having a handling device for transport of the substrate between a loading or unloading chamber and the plurality of treatment chambers.

* * * * *